(12) United States Patent
Li et al.

(10) Patent No.: US 11,472,696 B1
(45) Date of Patent: Oct. 18, 2022

(54) SEISMIC ACQUISITION SYSTEM AND SENSOR BASED ON MEMS SENSOR WITH LOW POWER CONSUMPTION

(71) Applicant: INSTITUTE OF GEOLOGY AND GEOPHYSICS, CHINESE ACADEMY OF SCIENCES, Beijing (CN)

(72) Inventors: Zongwei Li, Beijing (CN); Jing Liu, Beijing (CN); Yongjian Zhou, Beijing (CN); Changchun Yang, Beijing (CN); Kedu Han, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/842,846

(22) Filed: Jun. 17, 2022

(30) Foreign Application Priority Data

Mar. 23, 2022 (CN) .......................... 202210289229.6

(51) Int. Cl.
*B81B 3/00* (2006.01)
*B81B 7/02* (2006.01)

(52) U.S. Cl.
CPC .......... *B81B 3/0027* (2013.01); *B81B 3/0086* (2013.01); *B81B 7/02* (2013.01);
(Continued)

(58) Field of Classification Search
CPC ....... B81B 3/0027; B81B 3/0086; B81B 7/02; B81B 2201/0285; B81B 2203/04; B81B 2207/01; B81B 2207/03
See application file for complete search history.

(56) References Cited

U.S. PATENT DOCUMENTS 3,240,288 A * 3/1966 Ball .......................... G01V 1/42
367/28
3,778,759 A * 12/1973 Carroll .................. H04L 25/085
367/43
(Continued)

FOREIGN PATENT DOCUMENTS

CN 102265184 A 11/2011
CN 108255108 A 7/2018
(Continued)

*Primary Examiner* — David J Bolduc
(74) *Attorney, Agent, or Firm* — Nitin Kaushik

(57) ABSTRACT

The present disclosure belongs to the field of geological exploration, and particularly relates to a seismic acquisition system and a sensor based on an MEMS sensor with low power consumption, so as to solve the problem that the existing seismic wave acquisition technology cannot balance high accuracy and low power consumption when the MEMS sensor is used. The present disclosure comprises: the MEMS sensor is used for receiving seismic wave signals and outputting MEMS sensor electrical signals; a common-mode voltage adjustment module is used for adjusting the MEMS sensor signals to be within the input range of common-mode voltage of a readout circuit, so as to obtain low voltage MEMS sensor signals. In the present disclosure, high voltage ensures the detection accuracy of the MEMS sensor; and low voltage is supplied to the readout circuit, thereby reducing the power consumption of the overall seismic acquisition system.

8 Claims, 7 Drawing Sheets

(52) U.S. Cl.
CPC ... *B81B 2201/0285* (2013.01); *B81B 2203/04* (2013.01); *B81B 2207/01* (2013.01); *B81B 2207/03* (2013.01)

(56) References Cited

U.S. PATENT DOCUMENTS

| | | | | |
|---|---|---|---|---|
| 4,257,098 | A * | 3/1981 | Lacy | G01V 1/223 |
| 6,151,967 | A * | 11/2000 | McIntosh | G01D 5/2417 |
| | | | | 361/283.4 |
| 9,689,889 | B1 * | 6/2017 | Casiraghi | G01P 15/125 |
| 2009/0243722 | A1 * | 10/2009 | Liu | H03F 3/2173 |
| | | | | 330/251 |
| 2015/0082885 | A1 * | 3/2015 | Rinkio | B81B 7/02 |
| | | | | 73/504.12 |
| 2016/0116499 | A1 * | 4/2016 | Thompson | G01D 5/30 |
| | | | | 73/1.41 |
| 2019/0039884 | A1 * | 2/2019 | Dehe | G01L 9/0041 |
| 2019/0049482 | A1 * | 2/2019 | Motiee | G01P 15/125 |

FOREIGN PATENT DOCUMENTS

| | | |
|---|---|---|
| CN | 110380700 A | 10/2019 |
| CN | 110470861 A | 11/2019 |
| CN | 110763870 A | 2/2020 |
| CN | 112234987 A | 1/2021 |
| CN | 114018298 A | 2/2022 |

\* cited by examiner

SEISMIC ACQUISITION SYSTEM AND SENSOR BASED ON MEMS SENSOR WITH LOW POWER CONSUMPTION

CROSS-REFERENCE TO RELATED APPLICATIONS

The application claims priority to Chinese patent application No. 2022102892296, filed on Mar. 23, 2022, the entire contents of which are incorporated herein by reference.

TECHNICAL FIELD

The present disclosure belongs to the field of geological exploration, and particularly relates to a seismic acquisition system and a sensor based on an MEMS (Micro-Electro-Mechanical System) sensor with low power consumption.

BACKGROUND

In geological exploration, seismic wave signals need to be acquired continuously for a long time usually, and an MEMS sensor is taken as a commonly used sensor for acquisition of seismic waves.

In most frameworks of the existing MEMS sensor, single high power supply voltage is adopted for power supply, or positive-negative dual power supply voltage is adopted for power supply; such a circuit is very difficult to realize a goal of low power consumption; and the application scope of the MEMS sensor is limited, in particular to the application field which requires to use the single power supply voltage for power supply and meanwhile meets the requirement of low power consumption. Additionally, in order to meet low power consumption, low power supply voltage is mostly adopted for power supply, but the low power supply voltage limits the measurement range, the accuracy and the like of the MEMS sensor. Therefore, based on the application requirements of single power supply, multiple reference voltages and low power consumption, the present disclosure adopts a high voltage feedback and low voltage readout circuit technology and a common-mode voltage adaptive dynamic adjustment technology to adjust high feedback voltage to be within the input range of common-mode voltage of a low voltage readout circuit; high voltage in the MEMS sensor can ensure the sensitivity of the MEMS sensor; and on the premise of ensuring the system accuracy and the measurement range of the MEMS sensor, the goal of low power consumption of the MEMS sensor is realized, and the application scope of the MEMS sensor is expanded.

SUMMARY

In order to solve the above problem in the prior art, i.e. the problem that the existing seismic wave acquisition technology cannot balance high accuracy, low power consumption and high stability when an MEMS sensor is used, the present disclosure provides a seismic acquisition system based on an MEMS sensor with low power consumption. The system comprises an MEMS header module, a common-mode voltage adjustment module, a readout circuit, a feedback circuit and a power supply module;

the MEMS header module is used for receiving seismic wave signals and outputting MEMS electrical signals;

the common-mode voltage adjustment module is used for adjusting the MEMS electrical signals to be within the input range of common-mode voltage of the readout circuit, so as to obtain low voltage MEMS electrical signals;

the readout circuit is used for reading out the low voltage MEMS electrical signals, so as to obtain output signals;

the feedback circuit is used for generating feedback signals for a high power supply voltage power supply unit according to the output signals, so as to form a closed loop; and the high power supply voltage power supply unit comprises the MEMS header module and the common-mode voltage adjustment module; and the power supply module is used for supplying high power supply voltage to the MEMS header module and the common-mode voltage adjustment module and supplying low power supply voltage to a readout circuit module and the feedback circuit.

In some preferred implementation manners, the system also comprises a power supply acquisition module and a digital signal control module;

the power supply acquisition module is used for acquiring the high power supply voltage and the low power supply voltage, generating digital signals of power supply voltage corresponding to the high power supply voltage and the low power supply voltage, and transmitting the digital signals of the power supply voltage to the digital signal control module; and the digital signal control module is used for calculating common-mode voltage adjustment ratio signals at a digital domain according to the digital signals of the power supply voltage, generating timing control signals based on the common-mode voltage adjustment ratio signals, and controlling the common-mode voltage adjustment module.

In some preferred implementation manners, the low power supply voltage is supplied to the digital signal control module by the power supply module; and the low power supply voltage and the high power supply voltage are supplied to the power supply acquisition module by the power supply module.

In some preferred implementation manners, the power supply acquisition module is specifically composed of an ADC (Analog to Digital Converter) and is used for acquiring the high power supply voltage and the low power supply voltage and outputting the digital signals of the power supply voltage corresponding to the high power supply voltage and the low power supply voltage to the digital signal control module; and the digital signal control module is used for calculating a common-mode voltage adjustment ratio signal R;

if the high power supply voltage required by the MEMS header module is AVDD, the low power supply voltage required by the readout circuit is DVDD, reference voltage of the power supply acquisition module is Vref, and the number of digits of the ADC used for the power supply acquisition module is N, the numerical value of quantification $N_{AVDD}$ of the high power supply voltage AVDD is:

$$N_{AVDD} = \frac{V_{ref}}{2^N} AVDD$$

the numerical value of quantification $N_{DVDD}$ of the low power supply voltage DVDD is:

$$N_{DVDD} = \frac{V_{ref}}{2^N} DVDD$$

the common-mode voltage adjustment ratio signal R is:

$$R = \frac{DVDD}{AVDD}$$

the timing control signals are generated based on the common-mode voltage adjustment ratio signal R, so as to control the common-mode voltage adjustment module; and the timing control signals can be digital signals with a fixed pulse width and can also be digital signals with different pulse widths.

In some preferred implementation manners, the common-mode voltage adjustment module is specifically composed of one or more ½ circuit units; and each ½ circuit unit is that the MEMS header module is connected with a first switch S1, and then a first branch circuit and a second branch circuit are in parallel connection to a common node after the first switch S1;

the first branch circuit is that the first switch S1 is connected to the common node by a second switch S2;

the second branch circuit is that the first switch S1 is connected to the common node through a first capacitor C1 and then through a third branch circuit and a fourth branch circuit that are in parallel connection;

the third branch circuit is that a third switch S3 is connected to the common node;

the fourth branch circuit is that a fourth switch S4 and a second capacitor C2 are sequentially connected to the common node; and the common node is connected with the readout circuit module through a switch S5 or is connected with a feedback circuit module through a switch S6.

In some preferred implementation manners, the digital signal control module is specifically used for carrying out noise suppression and temperature compensation and calibration at the digital domain based on the digital signals generated by the power supply acquisition module, and calculating the common-mode voltage adjustment ratio signal R, so as to calculate the number N of ½ circuit units required by the common-mode voltage adjustment module and the corresponding timing control signals to adaptively control the common-mode voltage adjustment module to work.

In some preferred implementation manners, a circuit required by the common-mode voltage adjustment module can be a ⅓ circuit unit or a ¼ circuit unit.

In some preferred implementation manners, the timing control signals are specifically described as follows:

Mode 1: the first switch S1 and the third switch S3 are controlled to be on, and the second switch S2 and the fourth switch S4 are controlled to be off; the voltage in the first capacitor C1 in a mode 1 is $V_{C1}$; the voltage of an output node of the common-mode voltage adjustment module is $V_o$; and the voltage $V_c$ of a middle plate of a header of the MEMS sensor is:

$V_c = V_{C1} + V_o$

Mode 2: the first switch S1 and the third switch S3 are controlled to be off, and the second switch S2 and the fourth switch S4 are controlled to be on; the voltage in the first capacitor C1 in a mode 2 is $V_{C1}'$ and is equal to the voltage $V_{C1}$ in the first capacitor C1 in the mode 1; and the voltage of the output node of the common-mode voltage adjustment module is $V_o'$:

$V_o' = V_{C1}' = V_{C1}$ then the following formula is obtained, $$V_o' = \frac{1}{2} V_c$$

the voltage $V_o'$ of the output node of the common-mode voltage adjustment module is the voltage value input into the readout circuit, and the voltage value input into the readout circuit is reduced to ½ of the voltage of the middle plate of the MEMS header and is within the optimal input range of the common-mode voltage of the readout circuit.

In some preferred implementation manners, different proportions of adjustment for the common-mode voltage can be realized by adding switch combinations of the common-mode voltage adjustment module.

In some preferred implementation manners, the feedback circuit comprises an analog closed loop feedback mode and a digital closed loop feedback mode;

the analog closed loop feedback mode is specifically that output voltage of the feedback circuit is directly fed back to an electrode of a middle mass of the MEMS header; and the digital closed loop feedback mode is specifically that the feedback circuit is used for controlling the electrode of the middle mass to be connected to an upper plate or a lower plate according to digital signals output by the system.

Another aspect of the present disclosure provides the MEMS sensor with low power consumption, which is used for executing the above seismic acquisition system based on the MEMS sensor with low power consumption and used for converting rate, acceleration and angular rate into movement of the mass of the MEMS sensor, so as to cause a measurement task for the variation of differential capacitance.

The seismic acquisition system and the MEMS sensor with low power consumption of the present disclosure have the following beneficial effects.

(1) According to the seismic acquisition system based on the MEMS sensor with low power consumption, which is provided by the present disclosure, the problem of increased power consumption caused by sharp increase of current of the M EMS sensor and the circuits thereof in a downhole high temperature vibration detection scenarios, a high temperature vibration detection scenario of an engine and the like and the problem of instability or downtime of the system caused by a lot of produced heat are solved; and the heat effect is reduced by supplying different voltages to the header and the readout circuit, thereby ensuring the adaptability and stability of the MEMS sensor under various environments and prolonging the service life.

(2) For the seismic acquisition system based on the MEMS sensor with low power consumption, which is provided by the present disclosure, a single power supply is adopted for power supply; the high voltage ensures the detection accuracy of the MEMS sensor; and the low voltage is supplied to the readout circuit, thereby reducing the power consumption of the overall seismic acquisition system.

(3) The common-mode voltage adaptive dynamic adjustment module, the power supply acquisition module and the digital signal control module and the like of the present disclosure are combined to act; and according to the magnitude of the feedback voltage, the magnitude of the voltage of the middle plate, the magnitude of the power supply voltage and the like, the control signals for adjusting the common-mode voltage are adaptively generated, and the voltage of the middle plate of the MEMS sensor is adjusted to be within the common-mode voltage range or nearby the optimal common-mode voltage value of the readout circuit, so as to be adaptive to the common-mode input voltage of the low voltage readout circuit, thereby being beneficial to ensuring the system accuracy of the MEMS sensor and reducing the power consumption of the system.

(4) In the present disclosure, the high power supply voltage and the low power supply voltage are adopted respectively for power supply, and meanwhile, the problem that the common-mode voltage of the header of the MEMS sensor is inconsistent with the common-mode voltage of the readout circuit is solved, thereby avoiding the situations of reduction of the system accuracy and instability and further improving the adaptability and robustness of the system.

(5) In the present disclosure, by introducing the common-mode voltage adjustment module to adjust the common-mode voltage of the MEMS sensor and the readout circuit in a manner that the signals pass directly, compared with the traditional manner that DC (Direct Current) is isolated by capacitance to avoid inconsistence of the common-mode voltage, a DC component of the MEMS sensor is retained in the present disclosure, so that the MEMS sensor can not only ensure high performance and low power consumption, but also detect more information, such as information that whether the MEMS header is obliquely placed and other angular position information; and the application scope of the MEMS sensor is broadened, so that the MEMS sensor can operate stably in more scenarios.

DETAILED DESCRIPTION OF THE EMBODIMENTS

The present disclosure provides a seismic acquisition system based on an MEMS sensor with low power consumption; a single power supply is adopted for supplying power to the system; high voltage ensures the detection accuracy of the MEMS sensor; and low voltage is supplied to a readout circuit, thereby reducing the power consumption of the overall seismic acquisition system.

Figure 1:
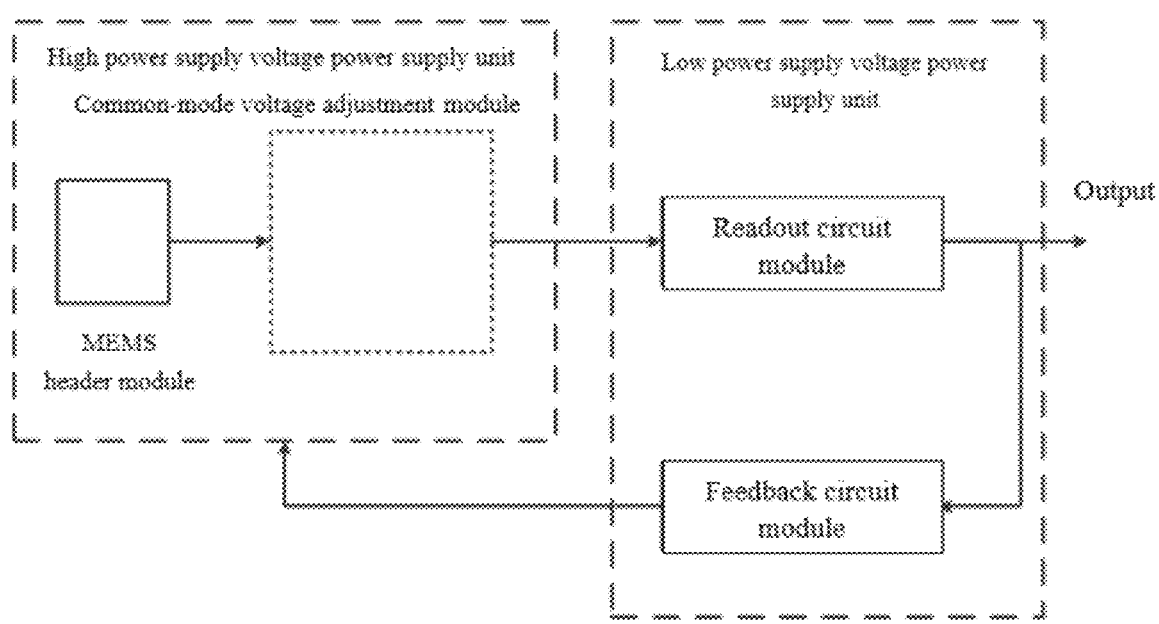
FIG. 1 is a structural schematic diagram of a seismic acquisition system based on an MEMS sensor with low power consumption in an embodiment of the present disclosure.

A seismic acquisition system based on an MEMS sensor with low power consumption in a first embodiment of the present disclosure is shown in FIG. 1. The system comprises an MEMS header module, a common-mode voltage adjustment module, a readout circuit, a feedback circuit and a power supply module;

the MEMS header module is used for receiving seismic wave signals and outputting MEMS electrical signals;

the common-mode voltage adjustment module is used for adjusting the MEMS electrical signals to be within the input range of common-mode voltage of the readout circuit, so as to obtain low voltage MEMS electrical signals;

the readout circuit is used for reading out the low voltage MEMS electrical signals, so as to obtain output signals;

the feedback circuit is used for generating feedback signals for a high power supply voltage power supply unit according to the output signals, so as to form a closed loop; and the high power supply voltage power supply unit comprises the MEMS header module and the common-mode voltage adjustment module; and the power supply module is used for supplying high power supply voltage to the MEMS header module and the common-mode voltage adjustment module and supplying low power supply voltage to a readout circuit module and the feedback circuit.

Figure 2:
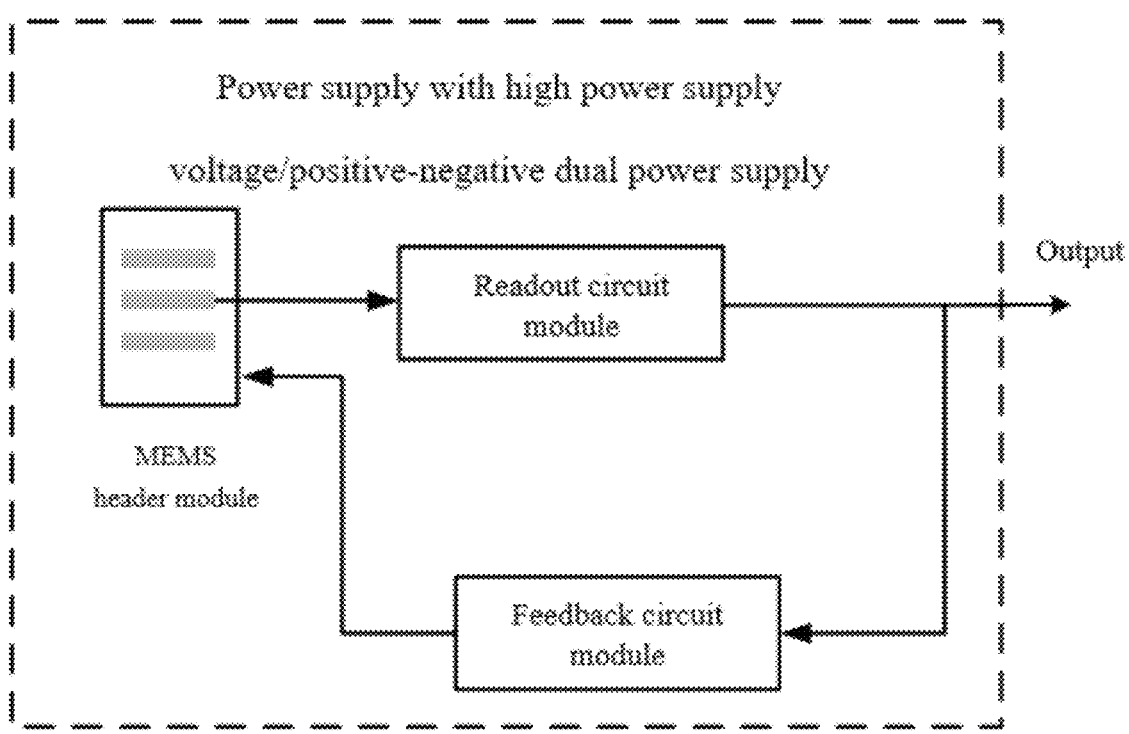
FIG. 2 is a structural schematic diagram of an existing MEMS sensor, to which power is supplied by single high power supply voltage/positive-negative dual power supply voltage.

The traditional MEMS sensor system is shown in FIG. 2, and usually, only high power supply voltage can be adopted for supplying power to all components. If the high power supply voltage is adopted for the MEMS sensor, the problem that common-mode voltage of a header of an MEMS sensor is inconsistent with common-mode voltage of a readout circuit is caused, and the system accuracy, the work stability and other parameters are affected.

For the traditional MEMS sensor, in a downhole high temperature vibration detection scenario, a high temperature vibration detection scenario of an engine and the like, current of the MEMS sensor is sharply increased by extreme conditions such as high temperature and the like, so as to cause increase of power consumption, which is bound to generate a lot of heat. The MEMS sensor is difficult to dissipate heat; a lot of heat generated is accumulated on the periphery of the MEMS sensor, and if the heat is not dissipated timely or is dissipated slowly, the service life of a chip of the MEMS sensor is affected, and the failure of the chip is caused in a serious case, leading to downtime of the system. By adopting a manner of supplying power to an MEMS header with high voltage and supplying power to the readout circuit with low voltage in the present disclosure, although the current is increased under the conditions of high temperature and vibration, as the readout circuit adopts low power supply voltage, the generated increase of power consumption is less than that of a manner of supplying power with single high power supply voltage; the degree of the heat effect is reduced; the influence to the service life of the chip of the MEMS sensor is relatively weaker; and therefore, the robustness of the MEMS sensor is higher.

A seismic acquisition system based on an MEMS sensor with low power consumption in a second embodiment of the present disclosure is shown in FIG. 2, which comprises an MEMS header module, a common-mode voltage adjustment module, a readout circuit, a feedback circuit and a power supply module; and for the MEMS sensor, the MEMS header module is used for receiving seismic wave signals and outputting MEMS electrical signals; the MEMS sensor comprises a shell, a mass and an electrode; and rate signals, acceleration signals, angular acceleration signals and the like are converted into movement of the mass of an MEMS header for reflection, so as to cause the variation of differential capacitance.

The common-mode voltage adjustment module is used for adjusting the MEMS electrical signals to be within the input range of common-mode voltage of the readout circuit, so as to obtain low voltage MEMS electrical signals;

in the embodiment, the common-mode voltage adjustment module is specifically composed of one or more ½ circuit units; and each ½ circuit unit is that the MEMS header module is connected with a first switch S1, and then a first branch circuit and a second branch circuit are in parallel connection to a common node after the first switch S1;

the first branch circuit is that the first switch S1 is connected to the common node by a second switch S2;

the second branch circuit is that the first switch S1 is connected to the common node through a first capacitor C1 and then through a third branch circuit and a fourth branch circuit that are in parallel connection;

the third branch circuit is that a third switch S3 is connected to the common node;

the fourth branch circuit is that a fourth switch S4 and a second capacitor C2 are sequentially connected to the common node; and the common node is connected with a readout circuit module through a switch S5 or is connected with a feedback circuit module through a switch S6.

The common-mode voltage adjustment module can be realized by a proportional circuit formed by operational amplifiers, capacitors and resistors.

In the embodiment, a circuit required by the common-mode voltage adjustment module can be a ⅓ circuit unit or a ¼ circuit unit; and the readout circuit is used for reading out the low voltage MEMS electrical signals, so as to obtain output signals; the readout circuit of the embodiment can be formed by a compensation capacitor, operational amplifiers, a feedback capacitor and digital control switch arrays controlled by a DSP (Digital Signal Processor) of the system; the number of the digital control switch arrays is preset; or, the readout circuit of the embodiment can be formed by a compensation capacitor, operational amplifiers and a feedback capacitor; the output of the readout circuit can be the current value or the voltage value; the output current value or the output voltage value is correspondingly proportional to the change of capacitance of the MEMS header; and the output of the readout circuit can be analog signals and can also be digital signals.

Figure 4:
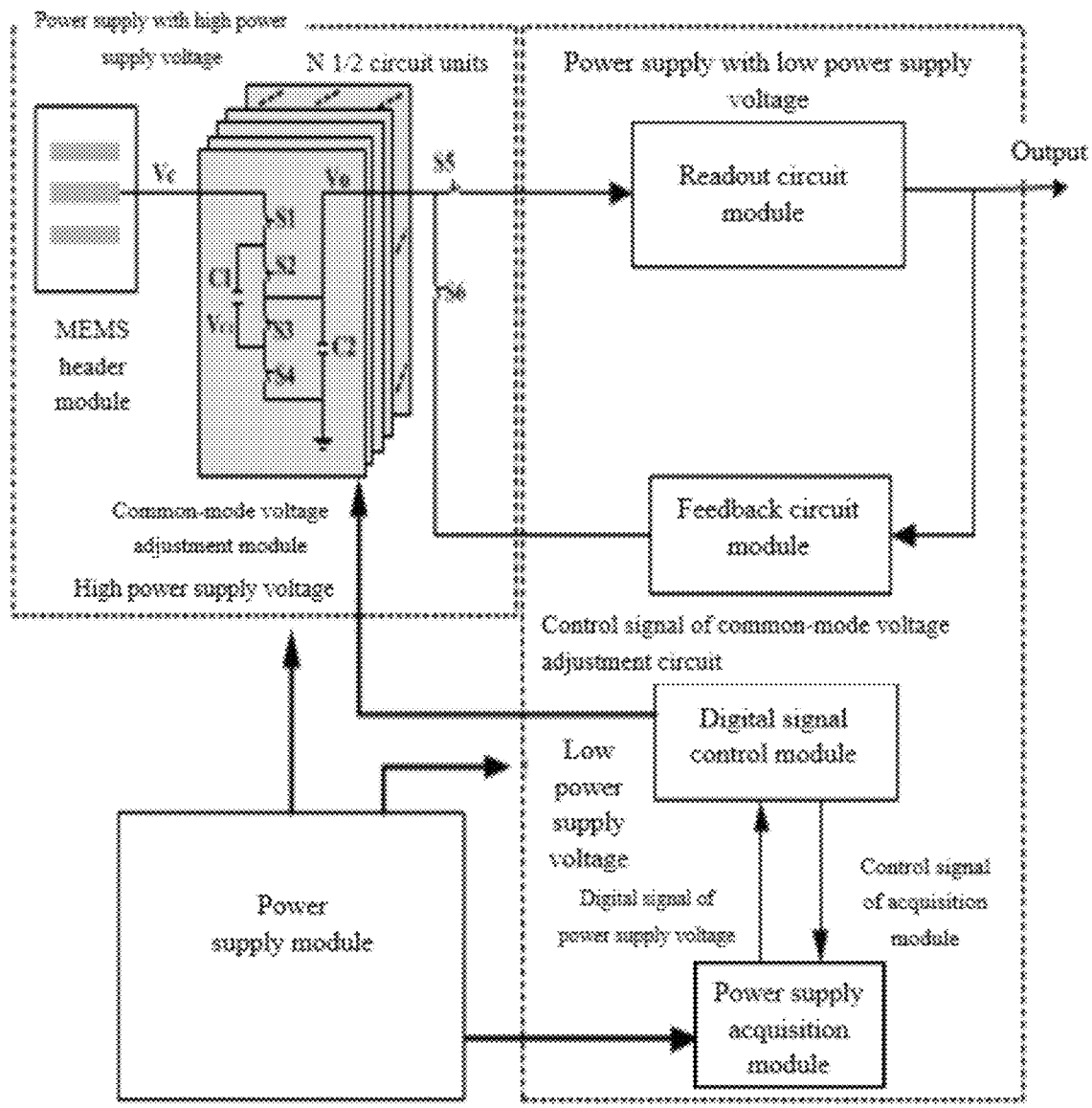
FIG. 4 is a structural schematic diagram of a seismic acquisition system based on an MEMS sensor with low power consumption, which comprises a digital signal control module and a power supply acquisition module, in an embodiment of the present disclosure.

The feedback circuit is used for is used for generating feedback signals for a high power supply voltage power supply unit according to the output signals, so as to form a closed loop; and the high power supply voltage power supply unit comprises the MEMS header module and the common-mode voltage adjustment module;

in the embodiment, the feedback circuit comprises an analog closed loop feedback mode and a digital closed loop feedback mode; and the analog closed loop feedback mode is specifically that the output voltage of the feedback circuit is amplified reversely and fed back to an electrode of a middle mass of the MEMS header by the common-mode voltage adjustment module; the feedback circuit is used for detecting low voltage analog signals that are proportional to signals detected by the MEMS sensor, the low voltage analog signals are converted into high voltage analog signals by a filter and a level switching circuit of the common-mode voltage adjustment module, and the high voltage analog signals are transmitted to the electrode of the middle mass of the MEMS header, so as to complete feedback; as show in FIG. 4, when only one ½ circuit unit is connected, common-mode voltage of the low voltage MEMS electrical signals transmitted to the readout circuit is reduced to ½ of common-mode voltage of MEMS electrical signals, and the feedback circuit is used for extracting output signals, amplifying the output signals into 2 times by the common-mode voltage adjustment module after being filtered and enabling the amplified output signals to be acted on a middle plate of the M EMS header module; the digital closed loop feedback mode is specifically that the feedback circuit is used for controlling the electrode of the middle mass to be connected to an upper polar plate or a lower polar plate according to the digital signals output by the system; the feedback circuit is used for detecting low voltage digital code stream that is proportional to the signals detected by the MEMS sensor; the low voltage digital code stream can be one or more bits, and the low voltage digital code stream is converted into high voltage analog signals by a DAC; and digital closed loop feedback is realized through the switches.

The feedback circuit can also be used for controlling the feedback signals by the switches, so as to realize reduction of reverse operation of feedback voltage and realize high voltage closed loop feedback.

The power supply module is used for supplying high power supply voltage to the MEMS sensor and the common-mode voltage adjustment module and supplying low power supply voltage to the readout circuit and the feedback circuit. The high power supply voltage and the high reference voltage of the polar plates can ensure the measurement range and the detection sensitivity of the MEMS sensor and improve the system performance; and the measurement range of the MEMS sensor is affected by the voltage:

$$\frac{2\varepsilon A V_{ref}^2}{d_0^2} = ma$$

wherein m represents the weight of the mass; $d_0$ represents a distance; A represents the area of the plate; $\varepsilon$ represents a dielectric constant; $V_{ref}$ represents the reference voltage; and a represents the maximum input acceleration. It can be seen that 20% of detection sensitivity is greatly reduced if the power consumption of the MEMS sensor is reduced in a manner of reducing the power supply voltage in the prior art.

The low power supply voltage is adopted for supplying power to the readout circuit, the feedback circuit and a digital signal control module to ensure reduction of the power consumption as far as possible under the condition of not affecting the detection accuracy of the MEMS sensor, thereby realizing optimization of the power consumption of an MEMS sensor system.

In the embodiment, the system also comprises a power supply acquisition module and the digital signal control module;

the power supply acquisition module is used for acquiring the high power supply voltage and the low power supply voltage, generating digital signals corresponding to the high power supply voltage and the low power supply voltage and transmitting the digital signals to the digital signal control module to be processed; and in the embodiment, the power supply acquisition module is specifically composed of an ADC and is used for acquiring the high power supply voltage and the low power supply voltage and outputting the digital signals corresponding to the high power supply voltage and the low power supply voltage to the digital signal control module; the digital signal control module is used for calculating common-mode voltage adjustment ratio signal R; the number of bits of the ADC of the embodiment depends on the amplitude of the analog voltage that needs to be quantified, such as 10-bit and 12-bit; the power supply acquisition module can be used for single-ended acquisition and can also be used for fully differential acquisition; and the work of the ADC is controlled by the DSP, comprising that whether sampling is carried out or not, setting for sampling frequencies, adjustment for the reference voltage and the like.

If the high power supply voltage required by the MEMS header is AVDD, the low power supply voltage required by the readout circuit is DVDD, the reference voltage of the power supply acquisition module is Vref, and the number of digits of the ADC used for the power supply acquisition module is N; and the numerical value of quantification $N_{AVDD}$ of the high power supply voltage AVDD is:

$$N_{AVDD} = \frac{V_{ref}}{2^N} AVDD$$

the numerical value of quantification $N_{DVDD}$ of the low power supply voltage DVDD is:

$$N_{DVDD} = \frac{V_{ref}}{2^N} DVDD$$

the common-mode voltage adjustment ratio signal R is:

$$R = \frac{DVDD}{AVDD}$$

the timing control signals are generated based on the common-mode voltage adjustment ratio signal R, so as to control the common-mode voltage adjustment module; and the timing control signals can be digital signals with a fixed pulse width and can also be digital signals with different pulse widths.

For the seismic acquisition system based on the MEMS sensor with low power consumption of the present disclosure, different proportions of adjustment for the common-mode voltage can be realized by adding switch combinations of the common-mode voltage adjustment module.

The digital signal control module is used for carrying out digital operation on the digital signals corresponding to the high power supply voltage and the low power supply voltage at a digital domain and generating common-mode voltage adjustment digital signals based on digital operation results to control the common-mode voltage adjustment module.

In the embodiment, the digital signal control module is specifically used for carrying out noise suppression and temperature compensation and calibration at the digital domain based on the digital signals generated by the power supply acquisition module, and calculating the common-mode voltage adjustment ratio signal R, so as to calculate the number N of ½ circuit units required by the common-mode voltage adjustment module and the corresponding timing control signals to adaptively control the common-mode voltage adjustment module to work, the value of R can be ½, ⅓ and the like, and N can be 1, 2, 3, 4 and the like. The multiple ½ circuit units are in series connection with one another, and the digital signal control module is used for determining to connect N ½ circuit units that are in series connection into a circuit according to the common-mode voltage adjustment ratio signal R. The digital signal control module can adopt a digital processing chip of the DSP/a digital processing chip of an FPGA (Field Programmable Gate Array) and the like to control working states of the ADC of the power supply acquisition module, comprising that whether sampling is carried out or not, the setting for the sampling frequencies, the adjustment for the reference voltage and the like; and the common-mode voltage adjustment module can be closed according to the output of the power supply acquisition module, so as to reduce the power consumption of the system.

Figure 5:
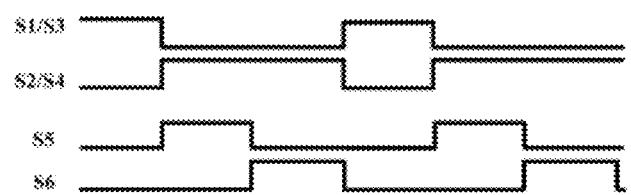
FIG. 5 is a diagram of on-off states of switches of the common-mode voltage adjustment module in a control process in the embodiment of the present disclosure.

In the embodiment, the timing control signals are specifically described as follows:

on-off states of the switches in a control process are shown in FIG. 5;

Mode 1: the first switch S1 and the third switch S3 are controlled to be on, and the second switch S2 and the fourth switch S4 are controlled to be off; the voltage in the first capacitor C1 in a mode 1 is $V_{C1}$; the voltage of an output node of the common-mode voltage adjustment module is $V_0$; and the voltage $V_c$ of the middle plate of the header of the MEMS sensor is:

$$V_c = V_{C1} + V_o$$

Mode 2: the first switch S1 and the third switch S3 are controlled to be off, and the second switch S2 and the fourth switch S4 are controlled to be on; the voltage in the first capacitor C1 in a mode 2 is $V_{C1}'$ and is equal to the voltage $V_{C1}$ in the first capacitor C1 in the mode 1; and the voltage of the output node of the common-mode voltage adjustment module is $V_o'$:

$$V_o' = V_{C1}' = V_{C1}$$

then the following formula is obtained, $$V_o\prime = \frac{1}{2} V_c$$

the voltage $V_o'$ of the output node of the common-mode voltage adjustment module is the voltage value input into the readout circuit, and the voltage value input into the readout circuit is reduced to ½ of the voltage of the middle plate of the MEMS header and is nearby the optimal input value of the common-mode voltage of the readout circuit. In the embodiment, the optimal input value is at the ½ position of the power supply voltage of the readout circuit; and for example, if the power supply voltage is 3.3 V, the optimal value of the common-mode voltage is 1.65 V.

Figure 3:
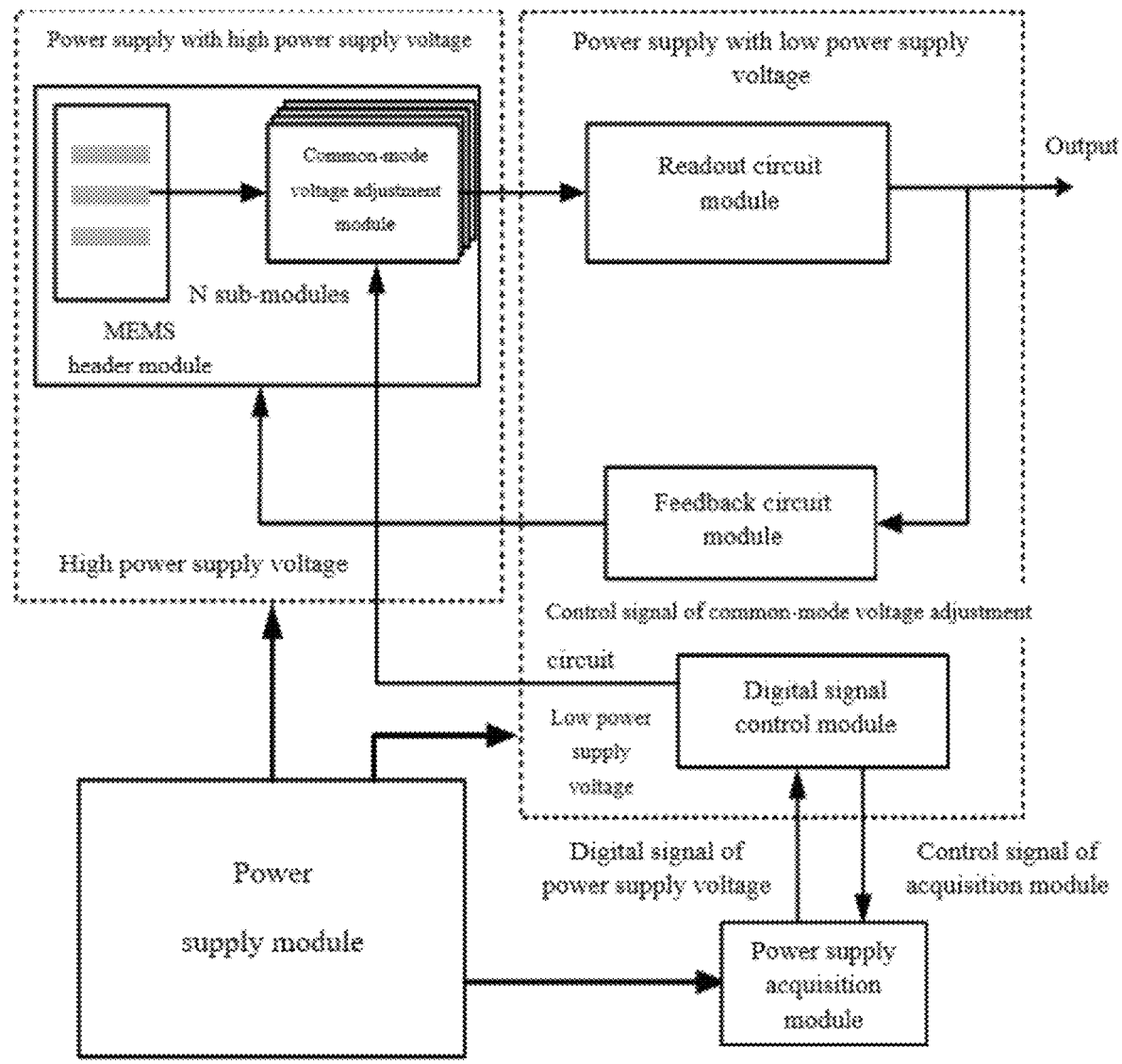
FIG. 3 is a schematic diagram of connection of circuits of a common-mode voltage adjustment module in the embodiment of the present disclosure.

By taking a circuit shown in FIG. 3 and FIG. 4 as an example, in the circuit of the common-mode voltage adjustment module, an on-off sequence of the switch S1/S3, the switch S2/S4, the switch S5 and the switch S6 is shown in FIG. 5; in a period that the switch S1/S3 is off, and the switch S2/S4 is on, firstly, the switch S5 is executed to be on, and the switch S6 is executed to be off, so as to realize reading for the MEMS electrical signals; then, the switch S5 is executed to be off, and the switch S6 is executed to be on; and the feedback circuit module is used for amplifying the feedback signals by the common-mode voltage adjustment module and then transmitting the amplified feedback signals to the middle plate of the MEMS header;

The high power supply voltage AVDD is adopted for supplying power to an MEMS sensor end, and the low power supply voltage DVDD is adopted for supplying power to a part of the readout circuit, AVDD>DVDD; by taking AVDD=10V and DVDD=5V as an example, the common-mode voltage of the middle plate of the header of the MEMS sensor is 5V, and the common-mode voltage of the readout circuit is 2.5 V; and the common-mode voltage adjustment module needs to reduce the common-mode voltage of the middle plate of the header of the MEMS sensor to 2.5 V, so as to meet the input requirement of the common-mode voltage of the readout circuit, thereby improving the system accuracy and the stability to the greatest extent.

The power supply module is used for supplying the low power supply voltage to the digital signal control module; and the power supply module is used for supplying the low power supply voltage and the high power supply voltage to the power supply acquisition module. Additionally, the power supply module is also used for supplying the high reference voltage of the polar plates to the MEMS sensor and supplying the reference voltage to the power supply acquisition module.

Figure 6:
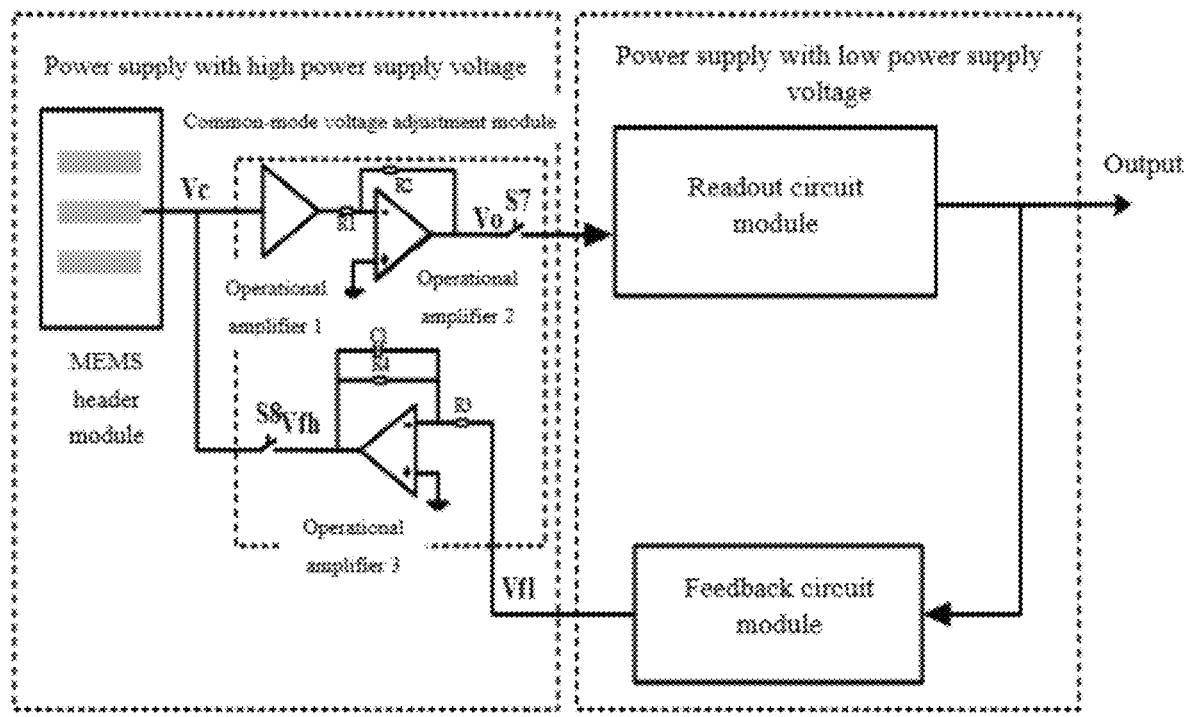
FIG. 6 is a structural schematic diagram of a seismic acquisition system based on an MEMS sensor with low power consumption, which adopts operational amplifiers to realize a common-mode voltage adjustment module, in an embodiment of the present disclosure.

The second embodiment of the present disclosure provides a circuit for realizing a common-mode voltage adjustment module by operational amplifiers. As shown in FIG. 6, an MEMS header module, the readout circuit module and the feedback circuit module of the embodiment are consistent with those of the first embodiment of the present disclosure, which are not repeated in the embodiment.

Figure 7:
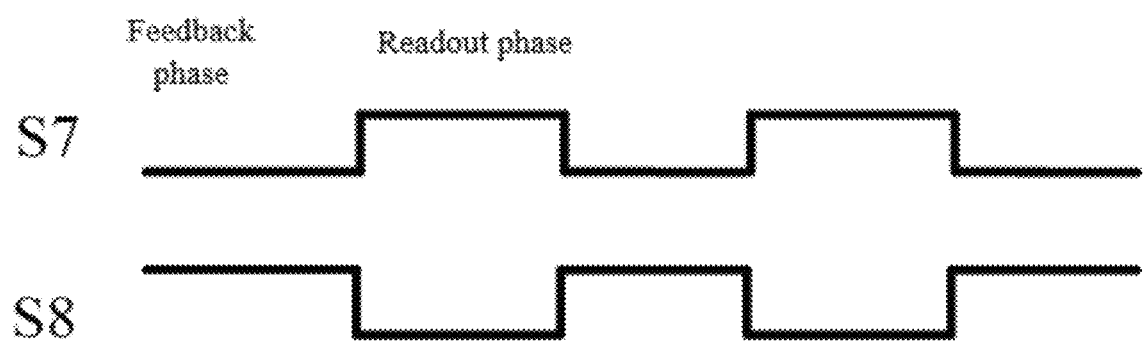
FIG. 7 is a diagram of on-off states of switches of the common-mode voltage adjustment module in a feedback process of the seismic acquisition system based on the MEMS sensor with low power consumption, which adopts the operational amplifiers to realize the common-mode voltage adjustment module, in the embodiment of the present disclosure.

In the embodiment, the common-mode voltage adjustment module comprises a first sub-circuit and a second sub-circuit that are in parallel connection;

The first sub-circuit is that the MEMS header module is sequentially connected with an operational amplifier 1, a first resistor R1 and an operational amplifier 2 in series; and a non-inverting input end of the operational amplifier 2 is connected with ground, an inverting input end of the operational amplifier 2 is connected with an output end of the operational amplifier 2 by a second resistor R2, and the output end of the operational amplifier 2 is connected to the readout circuit module through a switch S7;

The second sub-circuit is that the feedback circuit module is connected to the MEMS header module through a third resistor R3, an operational amplifier 3 and a switch S8; and a non-inverting input end of the operational amplifier 3 is connected with ground, the third resistor R3 is connected with an inverting input end of the operational amplifier 3, and the inverting input end of the operational amplifier 3 is connected to an output end through a first capacitor C1 and a fourth resistor R4 that are in parallel connection;

R1=R4, and R2=R3; on-off states of the switches of the circuit for realizing the common-mode voltage adjustment module by the operational amplifiers are shown in FIG. 7, comprising a feedback phase and a readout phase; when the MEMS electrical signal output by the MEMS header module is $$V_C, V_o = \frac{R2}{R1} * V_C;$$

when the output signal detected by a feedback circuit is $V_{fi}$, the feedback signal transmitted to the MEMS header module is:

$$V_{fh} = \frac{R4}{R3} * V_{fi};$$

and when R1=2*R2, V0=0.5$V_C$, and $V_{fh}$=2*$V_{fi}$;

In the embodiment, signal attenuation caused by adjustment for common-mode voltage is compensated through feedback control, so that times of signal attenuation of a forward path of the common-mode voltage adjustment module are consistent with times of signal amplification of a feedback path thereof. A capacitor filtering technology is added in the feedback circuit module to improve the quality of the feedback signals, so as to improve the system accuracy. In the embodiment, the MEMS header can be isolated under the condition of scaling down the common-mode voltage through combination of the operational amplifier 1 and the operational amplifier 2, so as to avoid reduction of the detection accuracy caused by that the quantity of electric charges of the header is affected by the change of the quantity of electric charges of the operational amplifier 2.

The MEMS sensor with low power consumption in a third embodiment of the present disclosure is used for executing the above seismic acquisition system based on the MEMS sensor with low power consumption and is used for converting rate, acceleration and angular rate into movement of the mass of the MEMS header, so as to cause a measurement task for the variation of differential capacitance, such as health monitoring for buildings of a bridge, a dam and the like, detection for vibration of an engine, measurement for a dip angle, automatic calibration of a robot and the like.

What is claimed is:

1. A seismic acquisition system based on an MEMS sensor with low power consumption, comprising: an MEMS header module, a common-mode voltage adjustment module, a readout circuit, a feedback circuit, a power supply module, a power supply acquisition module and a digital signal control module;

the MEMS header module is used for receiving seismic wave signals and outputting MEMS electrical signals;

the common-mode voltage adjustment module is used for adjusting the MEMS electrical signals to be within the input range of common-mode voltage of the readout circuit, so as to obtain low voltage MEMS electrical signals;

the power supply acquisition module is used for acquiring the high power supply voltage and the low power supply voltage, generating digital signals of power supply voltage corresponding to the high power supply voltage and the low power supply voltage, and transmitting the digital signals of the power supply voltage to the digital signal control module;

the digital signal control module is used for calculating common-mode voltage adjustment ratio signals at a digital domain according to the digital signals of the power supply voltage, generating timing control signals based on the common-mode voltage adjustment ratio signals, and controlling the common-mode voltage adjustment module;

the readout circuit is used for reading out the low voltage MEMS electrical signals, so as to obtain output signals;

the feedback circuit is used for generating feedback signals for a high power supply voltage power supply unit according to the output signals, so as to form a closed loop; and the high power supply voltage power supply unit comprises the MEMS header module and the common-mode voltage adjustment module; and the power supply module is used for supplying high power supply voltage to the MEMS header module and the common-mode voltage adjustment module and supplying low power supply voltage to a readout circuit module and the feedback circuit.

2. The seismic acquisition system based on the MEMS sensor with low power consumption according to claim 1, wherein the low power supply voltage is supplied to the digital signal control module by the power supply module; and the low power supply voltage and the high power supply voltage are supplied to the power supply acquisition module by the power supply module.

3. The seismic acquisition system based on the MEMS sensor with low power consumption according to claim 1, wherein the power supply acquisition module is specifically composed of an ADC and is used for acquiring the high power supply voltage and the low power supply voltage and outputting the digital signals of the power supply voltage corresponding to the high power supply voltage and the low power supply voltage to the digital signal control module; and the digital signal control module is used for calculating a common-mode voltage adjustment ratio signal R;

if the high power supply voltage required by the MEMS header module is AVDD, the low power supply voltage required by the readout circuit is DVDD, reference voltage of the power supply acquisition module is Vref, and the number of digits of the ADC used for the power supply acquisition module is N, the numerical value of quantification $N_{AVDD}$ of the high power supply voltage AVDD is:

$$N_{AVDD} = \frac{V_{ref}}{2^N} AVDD$$

the numerical value of quantification $N_{DVDD}$ of the low power supply voltage DVDD is:

$$N_{DVDD} = \frac{V_{ref}}{2^N} DVDD$$

the common-mode voltage adjustment ratio signal R is:

$$R = \frac{DVDD}{AVDD}$$

the timing control signals are generated based on the common-mode voltage adjustment ratio signal R, so as to control the common-mode voltage adjustment module; and the timing control signals are digital signals with a fixed pulse width or digital signals with different pulse widths.

4. The seismic acquisition system based on the MEMS sensor with low power consumption according to claim 3, wherein the common-mode voltage adjustment module is specifically composed of one or more ½ circuit units; and each ½ circuit unit is that the MEMS header module is connected with a first switch S1, and then a first branch circuit and a second branch circuit are in parallel connection to a common node after the first switch S1;

the first branch circuit is that the first switch S1 is connected to the common node by a second switch S2;

the second branch circuit is that the first switch S1 is connected to the common node through a first capacitor C1 and then through a third branch circuit and a fourth branch circuit that are in parallel connection;

the third branch circuit is that a third switch S3 is connected to the common node;

the fourth branch circuit is that a fourth switch S4 and a second capacitor C2 are sequentially connected to the common node; and the common node is connected with the readout circuit module through a switch S5 or is connected with a feedback circuit module through a switch S6.

5. The seismic acquisition system based on the MEMS sensor with low power consumption according to claim 4, wherein the digital signal control module is specifically used for carrying out noise suppression and temperature compensation and calibration at the digital domain based on the digital signals generated by the power supply acquisition module, and calculating the common-mode voltage adjustment ratio signal R, so as to calculate the number N of ½ circuit units required by the common-mode voltage adjustment module and the corresponding timing control signals to adaptively control the common-mode voltage adjustment module to work.

6. The seismic acquisition system based on the MEMS sensor with low power consumption according to claim 5, wherein the timing control signals are specifically described as follows:

mode 1: the first switch S1 and the third switch S3 are controlled to be on, and the second switch S2 and the fourth switch S4 are controlled to be off; the voltage in the first capacitor C1 in a mode 1 is $V_{C1}$; the voltage of an output node of the common-mode voltage adjustment module is $V_o$; and the voltage $V_c$ of a middle polar plate of a header of the MEMS sensor is:

$$V_c = V_{C1} + V_o$$

mode 2: the first switch S1 and the third switch S3 are controlled to be off, and the second switch S2 and the fourth switch S4 are controlled to be on; the voltage in the first capacitor C1 in a mode 2 is $V_{C1}'$ and is equal to the voltage $V_{C1}$ in the first capacitor C1 in the mode 1; and the voltage of the output node of the common-mode voltage adjustment module is $V_o'$:

$$V_o' = V_{C1}' = V_{C1}$$

then the following formula is obtained, $$V_o' = \frac{1}{2} V_c$$

the voltage $V_o'$ of the output node of the common-mode voltage adjustment module is the voltage value input into the readout circuit, and the voltage value input into the readout circuit is reduced to ½ of the voltage of the middle plate of the MEMS header and is within the optimal input range of the common-mode voltage of the readout circuit.

7. The seismic acquisition system based on the MEMS sensor with low power consumption according to claim 4, wherein different proportions of adjustment for the common-mode voltage can be realized by adding switch combinations of the common-mode voltage adjustment module.

8. The seismic acquisition system based on the MEMS sensor with low power consumption according to claim 1, wherein the feedback circuit comprises an analog closed loop feedback mode and a digital closed loop feedback mode;

the analog closed loop feedback mode is specifically that output voltage of the feedback circuit is directly fed back to an electrode of a middle mass of the MEMS header; and the digital closed loop feedback mode is specifically that the feedback circuit is used for controlling the electrode of the middle mass to be connected to an upper plate or a lower plate according to digital signals output by the system.

* * * * *